United States Patent [19]
Fitch et al.

[11] Patent Number: 5,308,788
[45] Date of Patent: May 3, 1994

[54] TEMPERATURE CONTROLLED PROCESS FOR THE EPITAXIAL GROWTH OF A FILM OF MATERIAL

[75] Inventors: Jon T. Fitch, Austin; Dean J. Denning, Del Valle; Carlos A. Mazuré, Austin, all of Tex.

[73] Assignee: Motorola, Inc., Schaumburg, Ill.

[21] Appl. No.: 49,645

[22] Filed: Apr. 19, 1993

Related U.S. Application Data

[63] Continuation of Ser. No. 759,376, Sep. 13, 1991, abandoned.

[51] Int. Cl.⁵ .............. H01L 21/00; H01L 21/02; H01L 21/20; H01L 21/36
[52] U.S. Cl. .................. 437/81; 437/108; 437/946
[58] Field of Search .............. 437/81, 108, 946

[56] References Cited

U.S. PATENT DOCUMENTS 3,945,864  3/1976  Goldsmith et al. .............. 437/946
4,686,758  8/1987  Liu et al. .......................... 437/89

OTHER PUBLICATIONS

"Limited reaction processing: Silicon epitaxy," by J. F. Gibbons et al., Applied Physics Letters, Oct. 1985, vol. 47, No. 7, pp. 721-723.

"Low Temperature Surface Cleaning of Si and Its Application to Silicon MBE," by A. Ishizaka et al., Journal of the Electrochemical Society, Apr. 1986, vol. 133, No. 4, pp. 666-671.

Primary Examiner—R. Bruce Breneman
Assistant Examiner—B. Everhart
Attorney, Agent, or Firm—Keith E. Witek

[57] ABSTRACT

A ramp activated low temperature quality epitaxial growth process. A substrate is pre-conditioned and a passivation layer overlying the substrate surface is formed. The substrate is introduced into a process chamber having a controlled temperature. A process chamber purge technique is used to remove oxygen and contaminants from the process chamber before epitaxial growth begins. A process gas, which has an epitaxial growth species, a process chamber purging species and other possible species, is introduced into the process chamber at a low temperature. The process gas and the passivation layer keep the process chamber environment and the substrate surface free from contamination and free from native oxide growth before and, in some cases, during epitaxial growth. The process chamber temperature is gradually elevated to initiate a quality epitaxial growth by starting growth relative to decomposition of the passivation layer.

30 Claims, 2 Drawing Sheets

TEMPERATURE CONTROLLED PROCESS FOR THE EPITAXIAL GROWTH OF A FILM OF MATERIAL

This application is a continuation of prior application Ser. No. 07/759,376, filed Sep. 13, 1991 now abandoned.

FIELD OF THE INVENTION

The present invention relates generally to semiconductor processing, and more particularly, to epitaxial growth processes.

BACKGROUND OF THE INVENTION

The integrated circuit industry is constantly trying to improve the performance, increase the reliability and reduce the cost and complexity of all semiconductor products. The development of epitaxial growth and most importantly, silicon epitaxial growth and selective epitaxial growth (SEG), was a result of the ongoing research to further the industry-wide goals of making these improvements. Epitaxy, when interpreted literally, is defined as "arranged upon", and in a more relevant manner is defined as "the growth on a crystalline substrate of a crystalline substance that mimics the orientation of the substrate."

The main impetus for developing epitaxial capability was to improve the performance of silicon bipolar transistors and the performance of bipolar integrated circuits in general. Therefore, epitaxial growth of a film or layer of material was used in early stages of development for the optimization of bipolar breakdown voltages between a collector and a substrate junction, while still maintaining a relatively low collector resistance. As the industry developed complementary metal oxide semiconductor (CMOS) devices, the uses for epitaxial growth extended to several other applications, some of which are: (1) isolation improvements; (2) the reduction in the well-known and understood latch-up phenomena; (3) radiation hardening of circuits; (4) the development of numerous silicon on insulator (SOI) technologies; (5) the development of three dimensional silicon structures; and (6) extended source and drain technology. The use of epitaxial growth has several unique advantages, some of which are: (1) greater layout and circuit flexibility; (2) more controllable device doping; (3) the ability to form buried layers of material; (4) the ability to form very sharp junctions, where sharp junctions are defined to be two regions of opposite conductivity type, referred to as a first conductivity and a second conductivity, separated by a thin transistion region wherein the conductivity in the transistion region transistions from the first conductivity to the second conductivity in a very abrupt manner and (5) reduction in oxygen, carbon, particulate, organic, heavy metal, sodium, and inorganic device impurities. Because of these mentioned applications and advantages it is easy to see the commercial value of epitaxial growth not only to silicon bipolar and silicon CMOS technology, but to other technologies such as bi-CMOS, which is the combination of bipolar and CMOS, and other technologies that could involve substrate materials or compounds other than silicon, such as germanium (Ge) or gallium-arsenide (GaAs).

Due to a large commercial market and the many uses of epitaxial growth, the process of growing epitaxial material is important. A known and widely used method of growing epitaxial silicon requires a high temperature hydrogen pre-bake of the substrate material to remove native oxide and contaminants from the substrate surface before initiating epitaxial growth. A 950° C. to 1000° C., or above, pre-bake was considered necessary to allow for good quality epitaxial growth. Quality epitaxial growth can be defined, in a very general way, as being a grown material exhibiting as few crystalline defects as possible, while in the same manner providing uniform coverage over the growth area. Epitaxial growth quality is usually determined by the quality of the substrate material due to the fact that the epitaxial growth is not usually more defect free than the substrate it is grown upon.

Although a hydrogen pre-bake produces a quality epitaxy as previously described, this pre-bake step has several disadvantages: (1) hydrogen enhanced boron penetration from conventional and widely used p+ conductivity type gates through surrounding oxides causes transistor threshold voltage (Vt) shifts and unwanted charge to transfer from doped areas to surrounding areas; (2) hydrogen is known for a phenomena called interface state density ($D_{it}$) generation wherein hydrogen at these temperatures severely attacks silicon dioxide ($SiO_2$) and creates defects that usually result in well known and documented device-degrading charge trap formation; (3) oxide undercutting has been observed where this high temperature pre-bake leads to severe etching and physical removal of exposed oxides; (4) higher temperatures in most integrated circuit equipment introduce more impurities into wafers; and (5) the breakdown voltage and charge breakdown resistance of transistor gate dielectrics, which are needed to be large for long lifetime and operational safety margins on most devices, are usually degraded. It is also known that any high temperature process suffers from known disadvantages, such as: (1) outward diffusion of device electrical junctions, such as a CMOS source and drain and/or a bipolar collector, emitter and base; (2) reduced electrical isolation; (3) mechanical wafer stress and strain, (4) known wafer warpage and wafer slip phenomena; (5) increased amounts of crystalline defects; and (6) autodoping, where impurities evaporate from one exposed section of a wafer and deposit onto another section of a wafer electrically doping the other section in an undesired manner.

Another method for epitaxial growth of a film or layer of material involves a widely used manufacturing technique known as "rapid thermal processing", (RTP). Rapid thermal processing is a method by which substrate wafers are instantaneously heated to a predetermined temperature and kept in that temperature for very short time durations. After this brief time duration the substrate wafers are cooled to near room temperature. Rapid thermal processing techniques are used in many integrated circuit processes and although they have advantages, such as reducing dopant transfer and impurity outdiffusion, these processes still have several of the disadvantages listed previously. The most unwanted disadvantage for epitaxial growth being the rapid incorporation of impurities such as oxygen, carbon, particulate, organic, heavy metal, sodium, and inorganics into all exposed portions of the wafer including the substrate surface on which epitaxial growth is to take place.

In general, the industry has developed several techniques in which epitaxial growth is possible. The majority of these techniques involve high temperature processing or a low temperature process that results in contaminated or defect laden epitaxial material.

SUMMARY OF THE INVENTION

The previously mentioned needs are fulfilled and other advantages achieved with the present invention, in which a temperature controlled process for epitaxial growth of a film of material is provided. In one form, the present invention comprises the steps of providing a pre-conditioned substrate material with a chemically passivated surface which retards native oxide growth. The substrate material is introduced into a process chamber. Oxygen is removed from the process chamber. A predetermined process gas having a predetermined quantity of a growth species is introduced into the process chamber to continually remove any oxygen from the process chamber. The temperature within the process chamber is gradually elevated for a predetermined amount of time to a predetermined temperature at which the process gas mixture is supersaturated with a growth species with respect to thermodynamic equilibrium. This supersaturation causes epitaxial growth to occur on the substrate material relative to when the chemically passivated surface is described.

The present invention will be understood by one skilled in the art from the detailed description below in conjunction with the accompanying drawings.

DESCRIPTION OF THE PREFERRED EMBODIMENT

As described herein, the present invention provides for quality epitaxial growth process that accomplishes or maintains the following: (1) no need for a pre-bake step; (2) reduce or avoid threshold voltage (Vt) shifts from hydrogen enhanced boron penetration; (3) reduce $D_{it}$ generation; (4) reduce oxide undercutting; (5) improve voltage and charge breakdown strength for transistor gate dielectrics; (6) reduce epitaxial material sidewall defects; (7) result in an epitaxial material of high quality; (8) be compatible with conventional processing techniques; (9) reduce impurity content in resulting epitaxial material; (10) reduce autodoping on exposed surfaces of wafers; (11) reduce junction outdiffusion; and (12) reduce wafer mechanical stress and strain.

A low temperature ramp-activated epitaxial growth mechanism is used which starts epitaxial growth relative to the loss of the substrate surface passivation layer. Initially a substrate is provided having a surface on which epitaxial growth is to take place. The substrate surface, which will act as a seed or starting material for epitaxial growth, is cleaned to remove various impurities. Once cleaned, removal of substrate native oxide, which usually hinders quality epitaxial growth, is performed and a passivation layer, which is usually of a chemical origin, is formed on the surface of the substrate where the epitaxial growth is to take place. The passivation layer will usually keep the surface conditioned, meaning it will minimize contaminants and stop native oxide growth, for a long time duration or until the substrate surface is heated to a higher temperature. Once the passivation layer is formed, the substrate is placed into a process chamber and the process chamber environment is purged of oxygen and contaminants to help the passivation layer keep the surface as clean and oxide-free as possible. The temperature of the process chamber is controllably increased by hardware, software or machine limitations in one of many ways to allow for epitaxial growth and the process chamber temperature is able to stay much lower than the temperature ranges of conventional epitaxial growth processes. The start of epitaxial growth is predetermined by process parameters such as process gas flow, pressure, temperature and other conditions and is initiated relative to the breakdown of the passivation layer. Thus, a low temperature ramp activated epitaxial growth process initiated relative to passivation layer breakdown is used to create quality epitaxial layers or formations.

Figure 1:
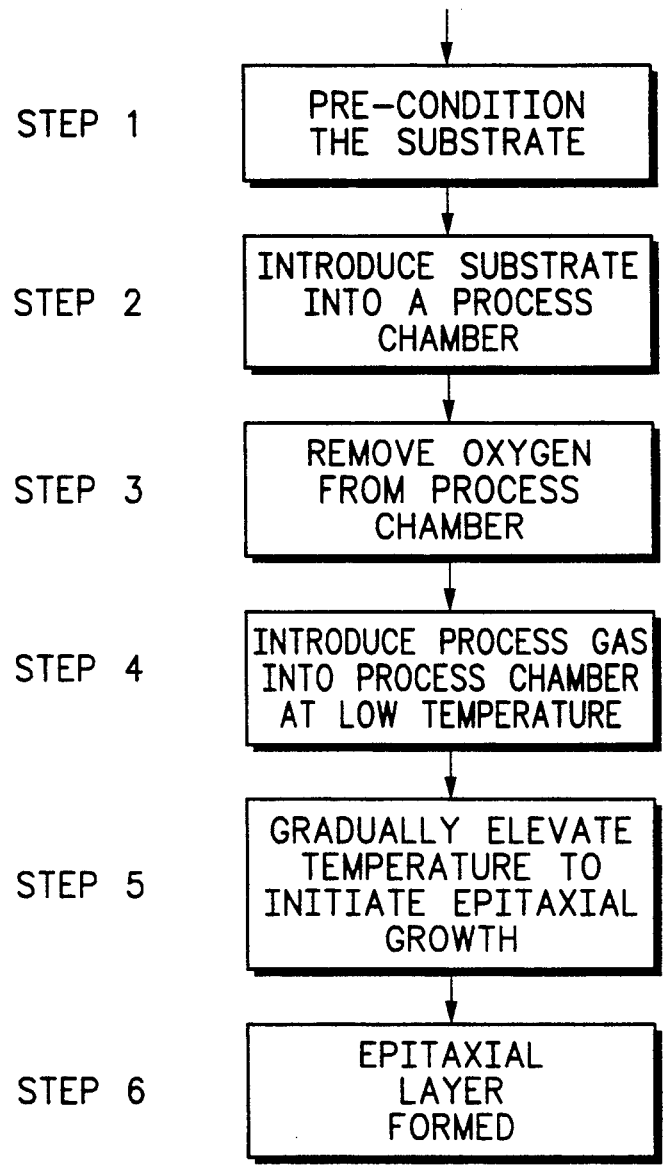
FIG. 1 illustrates, in flowchart form, a process for epitaxial growth in accordance with the present invention.

In more detail, illustrated in FIG. 1 is a flowchart that outlines, in sequential order, a set of steps that results in quality low temperature epitaxial growth in accordance with the present invention. Step 1 of FIG. 1 is an initial step of the epitaxial growth process and involves pre-conditioning the substrate material. Pre-conditioning can be performed in several ways and is a function of the intended application of the epitaxial material, the substrate material composition, such as germanium (Ge), gallium-arsenide (GaAs) or silicon (Si), and equipment or process limitations. For a silicon substrate material the pre-conditioning step usually starts with a cleaning cycle such as a conventional RCA oxidizing clean, an Ishizaka-Shiraki clean or an equivalent cleaning cycle. This cleaning cycle is performed to remove trace amounts of carbon, particulate, inorganic, and organic contamination from portions of the substrate that will be used as a seed material or starting material for epitaxial growth.

After the substrate surface has been cleaned, the substrate may still not be capable of quality epitaxial growth. Many conventional semiconductor substrate materials form what is known as a native oxide, which is a very thin oxide layer that grows on the substrate surface due to the fact that the substrate is almost always exposed to oxygen in the atmosphere. For silicon substrates, a total immersion of the substrate into a dilute hydraflouric (HF) and de-ionized (DI) water mixture, usually mixed from (10:1) to (100:1) respectively, is sufficient enough to remove the native oxide and form a hydrogen terminated silicon surface, called a passivation layer, on the silicon substrate to prevent further growth of the native oxide for hours. Once this hydrogen passivation layer is lost by heating to higher temperatures or from degradation over time the native oxide will return and hinder quality epitaxial growth. It is important to note that other compounds may be used to form this passivation layer for a silicon substrate and many techniques are also known for removing native oxides off of surfaces where the substrate material is germanium (Ge), gallium-arsenide (GaAs) or another semiconductor layer.

Once pre-conditioning is complete, Step 2 of FIG. 1 is performed. The substrate material is placed into an epitaxial reactor, a furnace or a heating mechanism which can, in general, be referred to as a process chamber. To avoid several problems such as mechanical stress and impurity diffusion, the substrate material is inserted at a low temperature which usually ranges anywhere from room temperature to a few hundred degrees Celsius.

The next step, step 3 in FIG. 1, is to remove oxygen and other contaminants from the process chamber. This removal ensures that the surface of the substrate used for epitaxial growth is free from contaminants and native oxide so that a quality epitaxial formation can be grown. Oxygen is usually removed from the process chamber by creating a vacuum in the process chamber. This vacuum not only removes unwanted oxygen and impurities from the process chamber but provides other well documented and known process advantages as well. In some applications and for some substrates it may not be necessary to produce a vacuum in the chamber. An alternative could involve the purging of contaminants and oxygen in the process chamber by a high gas flow, usually on the order of 10 to 100 standard liters per minute (SLPM), of a non-reactive inert gas such as Hydrogen ($H_2$) Nitrogen ($N_2$), Argon, or Helium. Other known methods, such as a reactive chemical purge, can also be used with similar results.

As illustrated in FIG. 1, a process gas is introduced into the process chamber in a Step 4 while the temperature is still relatively low. The process gas is at least one or more predetermined gases. The process gas serves several functions: (1) the gas must have the ability to keep oxygen and other contaminants chemically removed from the process chamber or chemically inactive in the process chamber; (2) the gas must be able to retard epitaxial growth up to a predetermined but selectable temperature; and (3) the gas must contain a reactant species that will permit epitaxial growth at a predetermined but selectable temperature. Continuing with a silicon substrate example, $SiH_2Cl_2$ is a compound that will serve two of these three functions. The $SiH_2Cl_2$ compound will keep removing oxygen from the process chamber to insure that no native oxide forms and that the grown epitaxy is free from contaminants and oxygen. $SiH_2Cl_2$ also provides the silicon (Si) necessary to start silicon epitaxial growth. HCl in the process chamber prevents the growth of epitaxial silicon until a predetermined and selectable temperature.

It should be well understood that the process gas could also include other gases that do not satisfy the three criterion specified previously for the process gas. For example, a silicon substrate process gas could contain a Phosphorus, Arsenic, Boron or equivalent doping compound to allow for in-situ, defined as "during growth", doping of the epitaxial silicon material. For silicon, an example of these compounds would be phosphine, diborane or arsine. An inert gas could also be introduced into the process gas as a carrier gas to aid the process gas flow in the process chamber. It should therefore be understood that other chemicals and compounds can be added to or substituted into the process gas to provide similar or additional benefits for silicon substrates, as well as other substrate materials, without departing from the scope of this invention.

Once the process gas is introduced into the process chamber at a relatively low temperature, the process chamber temperature is increased. The temperature can be raised in the process chamber in any gradually increasing manner such as an exponential function, a linear ramp, a stair-stepping ramp, a logarithmic function, or other manner. The increase in process chamber temperature can be machine dependant or predetermined and will take on the order of a few seconds to several minutes (such as one hour) to complete. The temperature will, for most applications, stop ramping at a final predetermined temperature, which will most likely be a temperature from 700° C. to 900° C., and is much lower than conventional epitaxial growth processing temperatures. This temperature ramp along with the flow rate and properties of the process gas will control the epitaxial growth.

Figure 2:
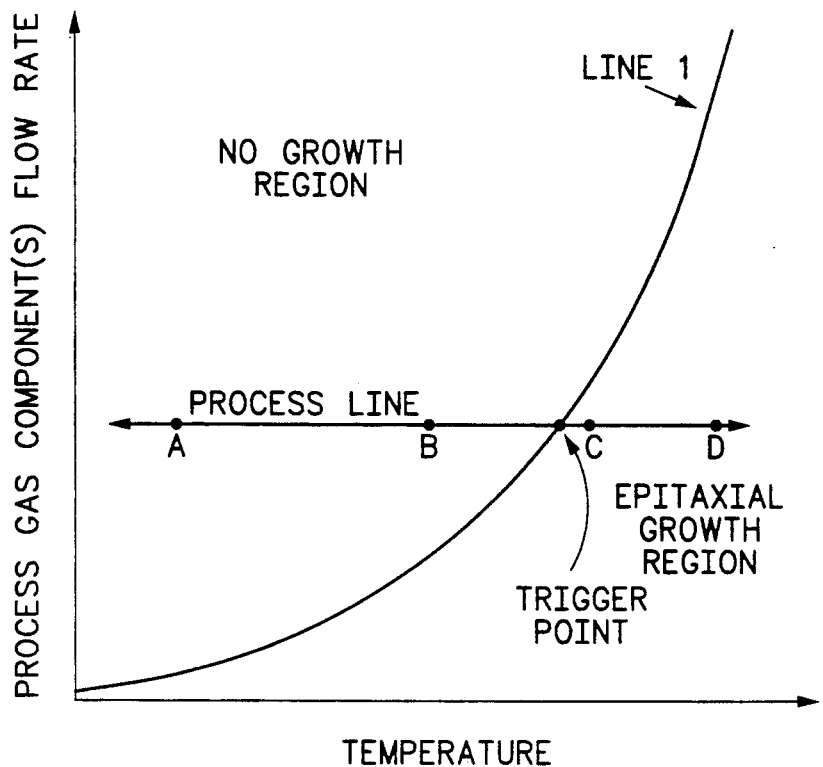
FIG. 2 is a graph illustrating epitaxial growth relationships with respect to process gas flow rate and temperature.

FIG. 2 further illustrates, in a mathematical relationship, an epitaxial growth process in accordance with the present invention. FIG. 2 is an X-Y two-dimensional representation of the temperature ramp and epitaxial growth mechanism disclosed above. The X-axis represents temperature and for a silicon substrate typically ranges from 500° C. to 850° C. The Y-axis, labeled "Process Gas Component(s) Flow Rate", represents the portion of the process gas used to retard epitaxial growth and is scaled in a measurement unit representing flow rate, which is standard cubic centimeters per minute (SCCM). For a silicon substrate, the Y-axis flow rate typically ranges from 0 SCCM to 120 SCCM. It is important to note that for silicon and especially for other substrate materials the process gas flow rate scale and the temperature scale can vary.

A curve labeled "Line 1" is illustrated in FIG. 2, and represents an experimentally derived curve for hydrochloric-acid (HCl), but can be derived for any component of the process gas that has the property of retarding epitaxial growth up to a predetermined but selectable temperature. "Line 1" partitions two regions. To the left of "Line 1" and above "Line 1", a region labeled the "No Growth Region" exists. If the temperature and gas flow are set so that the resulting X-Y intersection point lies in this region, for example Point A and Point B of FIG. 2, no epitaxial growth will occur. In fact, in the "No Growth Region", slight etching or removal of material will occur. For most applications and conditions, the etch rate, or amount of material removed per unit time in the "No Growth Region", has been experimentally observed to be very small and nearly nonexistent. The farther a point is from "Line 1" in the "No Growth Region", the greater the etch rate. To the right of "Line 1" and below "Line 1", a region called the "Epitaxial Growth Region" exists. If the temperature and gas flow are set so that the resulting X-Y intersection point lies in this region, for example Point C and Point D, epitaxial growth will occur. The farther a point is from "Line 1" in the "Epitaxial Growth Region", the greater the epitaxial growth rate. Therefore, "Line 1" also represents a curve over which epitaxial growth, which occurs in the "Epitaxial Growth Region", and etching, which occurs in the "No Growth Region", are balanced and neither etching or epitaxial growth occurs.

Assume Step 1, Step 2 and Step 3 of FIG. 1 have been performed. Assume that the process gas is fixed at a set SCCM level, for example 40 SCCM of HCl with $SiH_2Cl_2$ flowing at another predetermined rate, as described in Step 4 of FIG. 1. This process gas flow will define a curve labeled "Process Line" in FIG. 2, or a path that the process will follow when the process chamber temperature is increased or decreased. In addition, the process chamber temperature is set to, or ramped to, a low temperature, for example 500° C. Assume that the substrate is silicon for this example. The process is then at Point A on the "Process Line" in the "No Growth Region" in FIG. 2. The surface has been cleaned and hydrogen passivated, due to Step 1 of FIG. 1, so a clean and native-oxide-free epitaxial surface is available. Step 5 of FIG. 1 is then performed. The process chamber temperature is gradually elevated in any manner or function and the process will follow the horizontal "Process Line" due to the fixed process gas flow rate. After some time, the temperature elevation arrives at point B on the "Process Line" of FIG. 2. Point B is still in the "No Growth Region" and the etching at Point B is more neglible than the etching at Point A because Point B is closer to "Line 1" than the initial Point A. After a further increase in process chamber temperature the epitaxial growth process reaches the "Trigger Point" which marks the boundary of epitaxial growth and etching.

It is important to mention at this point in the temperature ramp that, the occurrence of the "Trigger Point" can be predetermined and accurately selected by process gas properties, gas flow, temperature and other physical, electrical, and chemical properties. The "Trigger Point" represents, in thermodynamic terms, the predetermined temperature at which the process gas mixture is supersaturated with the desired growth species with respect to thermodynamic equilibrium and epitaxial growth begins. For quality epitaxial growth of a film of material, the trigger point should be set properly. At some temperature, which is a function of the substrate material, passivation chemical type and other parameters, the passivation of the substrate, which is a hydrogen passivation for a silicon substrate, will breakdown. Epitaxial growth quality, thickness, impurity distribution, and other properties can vary by starting growth at the breakdown point, before this breakdown point or closely following this breakdown point. For the processing conditions of the presented example, which included a silicon substrate and a process gas of HCl and $SiH_2Cl_2$, the hydrogen passivation will start breaking down around 500° C. to 600° C. and completely breakdown around 750° C. Depending on equipment limitations, gas quality, the application, and other considerations, the flow rate, temperature ramp, composition of the process gas, pressure and other process parameters can be set such that the trigger point occurs either during, before, or after the passivation breakdown. The best epitaxial growth will occur, for most applications and processes, if the trigger point occurs before or during the passivation breakdown, for example at 680° C. This will ensure that the surface is free of contaminants and native oxide before epitaxial growth is initiated.

After passing the trigger point, which was predetermined and decided upon with the hydrogen passivation breakdown in mind, the gradual temperature increase brings the epitaxial growth process to Point C. At Point C where the epitaxial growth has started but the growth is a slow rate due to Point C being close to "Line 1". Once the process reaches a final temperature, for example 850° C., the process stays at Point D and a relatively high rate of growth continues until the process is at an end. It should also be mentioned that the process chamber may never come to a stable temperature and instead, end during the process chamber temperature ramp. In this case Point D of FIG. 2 represents the highest process chamber temperature achieved in the increasing process chamber temperature ramp.

Upon attaining a desired epitaxial growth, the process gas flow is reduced or ceased and the process chamber temperature is decreased to a lower temperature where removal of the substrate from the process chamber is feasible. An epitaxial layer or formation is now complete on the substrate material.

The inventive process described herein grows a quality epitaxial layer without the need for a pre-bake step and gives many other advantages. The elimination of a pre-bake step by the inventive process allows devices to be fabricated with epitaxial layer processing that will not shift threshold voltages (Vt) and reduces dopant outdiffusion. The reduced process chamber temperature and removal of the pre-bake will also reduce $D_{it}$ generation. Experimental scanning electron microscope (SEM) photos (not illustrated) of the inventive process have also shown a reduction in oxide undercutting that is common in many conventional epitaxial growth processes. The inventive low temperature ramp activated epitaxial process also improves the voltage and charge breakdown strength of transistor gates over conventional epitaxial technology. The inventive process also produces epitaxial layers with fewer sidewall defects. The inventive process is much more compatible with known process technology because the present invention uses low temperatures to achieve a quality epitaxial growth. The process chamber impurity purging mechanism that occurs in Step 3 of FIG. 1 reduces the process chamber impurity concentration. The process chamber impurity concentration is also reduced by the process gas throughout the temperature ramp of Step 5. Finally, the low temperature processing of the inventive process reduces the autodoping phenomena, junction outdiffusion and mechanical stress.

It should be well understood that the inventive process is not limited to a constant flow of process gas during the temperature ramp. In fact, by increasing and decreasing the process gas during the process chamber temperature ramp, many advantages can be gained. One example is illustrated in FIG. 3 where the process gas flow rate is increased in a stair-step function after growth has been initiated to further control epitaxial surface and bulk contaminant densities.

Figure 3:
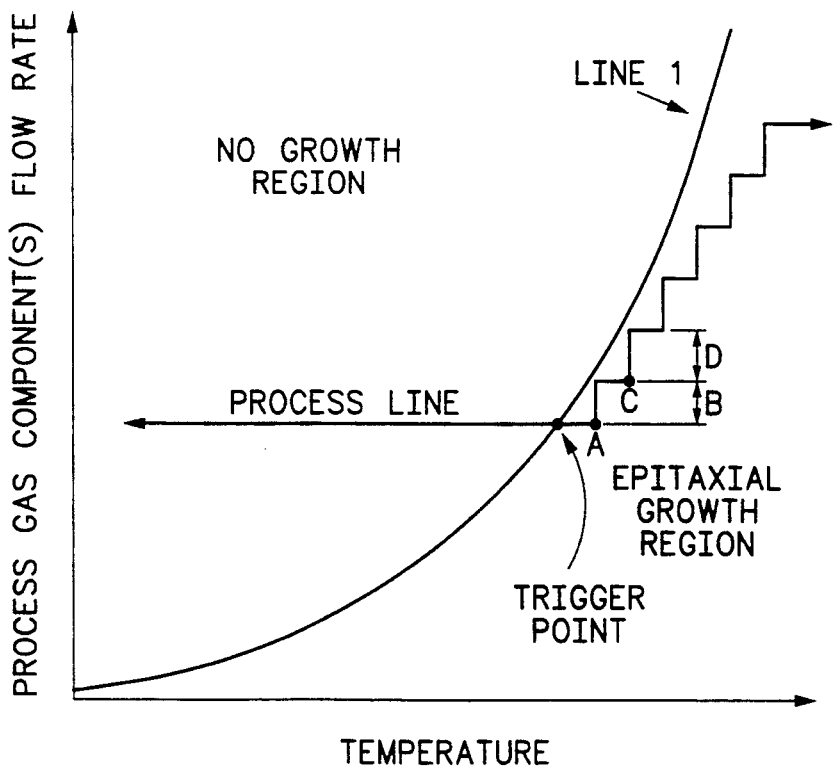
FIG. 3 is another graph illustrating epitaxial growth relationships with respect to process gas flow rate and temperature.

The X-Y plot of FIG. 3 has the same axes as FIG. 2 with the same scales described for FIG. 2. A curve labeled "Line 1" of FIG. 3 has the same meaning as the "Line 1" of FIG. 2 and separates the same two regions, a "No Growth Region" and an "Epitaxial Growth Region", both similar in definition to FIG. 2. The difference is that the process line is not strictly horizontal, but stair-steps due to the process gas flow rate increasing in steps after a "Trigger Point" is passed by the raising temperature ramp described by Step 5 of FIG. 1. Either hardware temperature sensors or software methods are used to detect the temperature. Once the temperature reaches a certain level indicated by Point A in FIG. 3, the process gas flow rate is incremented by a SCCM value of Length B, illustrated in FIG. 3. Once the temperature gets to Point C of FIG. 3, the gas flow rate is incremented by a SCCM value of Length D, and so on, until a predetermined value of temperature or process gas flow rate is achieved. The gas flow rate step technique described above causes the epitaxial growth rate to be increased in slow increments because the process line, which the process follows as the process chamber temperature is increased, is kept closer to "Line 1", which indicates a slow epitaxial growth. Even though the inventive process states that Step 3 of FIG. 1 and the process gas are intended to remove oxygen and also impurities from the process chamber, no oxygen and impurity removal in the process chamber can be 100% effective. If the chamber were to initiate growth rapidly, a few of the remaining impurities in the process chamber would cling to the substrate surface during initial epitaxial growth and result in an epitaxial growth of less quality. By ramping the process gas flow rate in a stair-step fashion to keep the process chamber near "Line 1" of FIG. 3 and therefore slightly within the "Epitaxial Growth Region", the impurities are more evenly distributed in the epitaxial formation and not grouped near the surface where it could adversely affect a quality epitaxial growth.

While the present invention has been illustrated and described with reference to specific embodiments, further modifications and improvements will occur to those skilled in the art. For example, the substrate material is not limited to silicon, the concept of a low temperature ramp activated epitaxial growth process is useful for other semiconductor substrates such as germanium (Ge), gallium-arsenide (GaAs), and other semiconductor technologies. The epitaxial growth defined in this process could be a planar epitaxial growth or a selective epitaxial growth of a layer of material. The process gas is not limited only to the chemicals mentioned. Some feasible process gas chemicals are $SiCl_2$, $SiCl_4$, $SiHCl_3$, $SiH_4$, $SiH_2Cl_2$, $HCl$, $Cl_2$, $Cl$, and $GeCl_2$, $GeCl_4$, $GeHCl_3$, and $GeH_4$ for the case of a germanium substrate material. Processing conditions such as pressure, starting temperature and processing equipment can vary a large amount without departing from the scope of this invention. It is also possible to ramp the temperature in many manners and control the process gas flow rate in many ways and still produce a similar process with a similar result. It is to be understood, therefore, that this invention is not limited to the particular forms illustrated and that it is intended in the appended claims to cover all modifications that do not depart from the spirit and scope of this invention.

We claim:

1. A process for expitaxial growth of a film of material, comprising the steps of:
   providing a pre-conditioned substrate material with a surface which is chemically passivated to retard native oxide growth;
   introducing the substrate material into a process chamber at a first temperature;
   removing oxygen from the process chamber to further avoid native oxide growth on the pre-conditioned substrate material;
   introducing a process gas into the process chamber, the process gas having a quantity of a growth species and a quantity of a cleaning species, the cleaning species etching the substrate material and the growth species containing atoms which epitaxially gather on the surface of the substrate material; and
   gradually elevating temperature during an amount of time within the process chamber to a temperature which is less than 900° C., the amount of time allowing the cleaning species to substantially clean the substrate material until the atoms which epitaxially gather on the surface of the substrate material begin to epitaxially grow the substrate at a faster rate than a cleaning rate of the surface of the substrate, the faster rate forming said epitaxial growth of the film of material.

2. The process of claim 1 wherein the step of gradually elevating temperature to a temperature further comprises determining the temperature dependent upon a flow rate of the process gas.

3. The process of claim 1 wherein the step of providing a pre-conditioned substrate material further comprises cleaning the substarte material by a cleaning cycle followed by subjecting the substrate material to 11F.

4. The process of claim 1 wherein the step of removing oxygen from the process chamber further comprises forming a vacuum in the process chamber to remove the oxygen.

5. The process of claim 1 wherein the step of removing oxygen from the process chamber further comprises purging the process chamber by flowing a carrier gas within process chamber.

6. The process of claim 1 wherein the step of introducing a process gas further comprises introducing a mixture of HCl and $SiH_2Cl_2$.

7. The process of claim 1 further comprising the steps of:
   forming a masking material overlying the substrate material, the masking material preventing epitaxial formation on the substrate material;
   patterning the masking material with a lithographic technique to form patterned portions of the masking material; and
   etching all patterned portions of the masking material to form openings in the masking material which expose the underlying substrate material for subsequent selective epitaxial growth.

8. The process of claim 1 wherein the step of gradually elevating temperature further comprises continually monitoring and adjusting the process gas flow to alter the epitaxial growth on the substrate material.

9. The process of claim 1 further comprising the steps of:
   reducing a process gas flow of the process gas from a first flow rate to a second flow rate; and
   reducing the temperature in the process chamber to a second temperature that is low enough to allow for removal of the substrate material from the process chamber without damage or contamination of the substrate material.

10. The process of claim 1 wherein the step of introducing a process gas further comprises introducing a process gas which comprises an additional species to electrically dope the epitaxial growth.

11. The process of claim 1 wherein the step of introducing a selected process gas further comprises introducing a gas carrier species to function as a transportation mechanism for the selected process gas.

12. A ramp activated process for forming an epitaxial layer of material, comprising the steps of:
   providing a silicon substrate material;
   cleaning the silicon substrate material to substantially remove contaminants from a surface of the substrate material;
   chemically passivating the surface of the substrate material with hydrogen bonds by immersing the substrate in a solution which comprises de-ionized water and hydrofluoric acid, the hydrogen bonds being used to retard native oxide growth on the surface;
   introducing the substrate material into a process chamber having a chamber temperature;
   removing oxygen and contaminants from the process chamber to further hinder growth of native oxide on the surface of the silicon substrate material by reducing process chamber pressure to a pressure;

introducing a process gas into the process chamber, the process gas retarding oxidation of the substrate material with a gas which comprises silicon, supporting formation of the epitaxial layer with the gas which comprises silicon, and both suppressing growth of the epitaxial layer and cleaning the substrate material below a trigger temperature with an etching gas;

gradually ramping up the chamber temperature during a time period comprising a range of at least substantially two seconds to several hours to an elevated temperature at which the trigger temperature is exceeded, the elevated temperature which is greater than the trigger temperature suppressing the cleaning of the substrate material via the etching gas and beginning epitaxial growth on the surface of the substrate material; and maintaining the elevated temperature for a amount of time to form the epitaxial layer of material.

13. The process of claim 12 further comprising the steps of:

forming a masking material overlying the silicon substrate material, the masking material preventing epitaxial formation on the silicon substrate material;

patterning the masking material with a photolithographic technique to form patterned portions of the masking material; and etching all patterned portions of the masking material to form openings in the masking material which expose the underlying silicon substrate material for subsequent selective silicon epitaxial growth.

14. A process for forming an epitaxially grown region comprising the steps of:

providing a substrate material in an ambient environment having a first temperature which is less than 700° C., the substrate material having a surface;

exposing the substrate material to a process gas, said process gas comprising both an etching gas and an epitaxial growth gas, the etching gas being used to clean the substrate material and the epitaxial growth gas being used to epitaxially grow epitaxial material on the surface of the substrate material; and controllably elevating the first temperature of the ambient environment to a second temperature, which is less than 900° C., to allow an epitaxial growth rate of the substrate material caused by the epitaxial growth gas to be greater than an etch rate caused by the etching gas, the greater epitaxial growth rate resulting in said epitaxial grown region being formed from the substrate material.

15. The process of claim 14 wherein the step of exposing the substrate material comprises exposing the substrate material to both HCl and a gas source which comprises silicon 16. The process of claim 14 further comprising the steps of:

forming a masking material overlying the substrate material, the masking material preventing epitaxial formation on the substrate material;

patterning the masking material to form patterned portions of the masking material; and etching all patterned portions of the masking material to form openings in the masking material which expose the underlying substrate material for subsequent selective epitaxial growth.

17. The process of claim 14 wherein the step of exposing the substrate material further comprises introducing into the process gas an additional gas used to electrically dope the epitaxial growth region.

18. The process of claim 14 wherein the step of exposing the substrate material further comprises introducing into the process gas a gas carrier species to function as a transportation mechanism for the process gas.

19. A process for forming a grown region in a semiconductor structure, the process comprising the steps of:

providing a substrate material;

exposing the substrate material to a chemical which forms a passivation layer overlying the substrate material, the passivation layer preventing material which is adverse to growth from forming on the substrate material;

placing the substrate material into an environment at a first temperature;

exposing the substrate material simultaneously to an etching gas and a growth gas within said environment, the etching gas removing the substrate material at an etch rate and the growth gas growing epitaxial material from the substrate material at a growth rate, said growth rate being less than said etch rate while the environment is at the first temperature;

controllably raising a temperature of the environment during a time period from the first temperature to a second temperature while the etching gas and the growth gas are within the environment, the passivation layer which overlies the substrate material being completely dissolved when the second temperature is reached; and controllably raising the temperature of the environment from the second temperature to a third temperature while the etching gas and the growth gas are within the environment, the etch rate becoming less than the growth rate when the third temperature is reached and said grown region forms from the substrate material.

20. The process of claim 19 wherein the step of raising the temperature of the environment from the second temperature to a third temperature comprises determining a value of the third temperature dependent upon a flow rate of the growth gas.

21. The process of claim 19 wherein the step of exposing the substrate material to a chemical comprises cleaning the substrate material by a cleaning cycle to form a clean surface of the substrate material and subjecting the clean surface of the substrate material to HF.

22. The process of claim 19 wherein the step of exposing the substrate material to a chemical further comprises forming a vacuum in the environment.

23. The process of claim 19 further comprising a step of:

exposing the substrate material to a carrier gas which removes oxygen from the environment before the step of controllably raising the temperature of the environment from the second temperature to a third temperature is performed.

24. The process of claim 19 wherein the step of exposing the substrate material simultaneously to an etching gas and a growth gas comprises introducing a mixture of HCl and $SiH_2Cl_2$ into the environment where the HCl functions as the etching gas and the $SiH_2Cl_2$ functions as the growth gas.

25. The process of claim 19 further comprising the steps of:

forming a masking material overlying the substrate material, the masking material preventing epitaxial formation on portions of the substrate material which are covered by the masking material;

patterning the masking material with a lithographic technique to form patterned portions of the masking material; and etching all patterned portions of the masking material to form openings in the masking material which expose the underlying substrate material for subsequent selective epitaxial growth.

26. The process of claim 19 wherein one of the steps of controllably raising the temperature of the environment further comprises continually monitoring and adjusting a growth gas flow to alter the epitaxial growth on the substrate material.

27. The process of claim 19 further comprising the step of:

changing a gas flow of both the etching gas and growth gas from a first flow rate to a second flow rate while the environment is changing from the first temperature to the second temperature.

28. The process of claim 19 wherein the step of exposing the substrate material simultaneously to an etching gas and a growth gas comprises introducing a doping gas into the environment which comprises a doping species which electrically dopes the grown region.

29. A process for forming a grown region from a surface of a substrate of a semiconductor, comprising the steps of:

placing the substrate into an environment having a first temperature;

exposing the substrate within the environment to a process gas wherein said process gas both cleans the surface of the substrate at a first rate and grows material on the surface of the substrate at a second rate; and elevating the first temperature of the environment to a second temperature, the process gas cleaning the surface of the substrate as temperature elevates from the first temperature to the second temperature, the second temperature making the first rate smaller than the second rate so that a material growth on the surface of the substrate is occurring at a faster rate than a cleaning of the surface of the substrate, the material growth on the surface of the substrate forming said grown region from the surface of the substrate.

30. The process of claim 29 wherein the step of exposing the substrate within the environment to a process gas comprises introducing a mixture of HCl and $SiH_2Cl_2$ into the environment where the HCl functions as an etching gas and the $SiH_2Cl_2$ functions as an epitaxial growth gas.

* * * * *

UNITED STATES PATENT AND TRADEMARK OFFICE
CERTIFICATE OF CORRECTION

PATENT NO. : 5,308,788
DATED : May 3, 1994
INVENTOR(S) : Jon T. Fitch, Dean J. Denning, Carlos A. Mazure'

It is certified that error appears in the above-identified patent and that said Letters Patent is hereby corrected as shown below:

Claim 3, Column 10, Line 3
    Change "substarte" to read --substrate--.

Claim 3, Column 10, Line 5
    Change "11F" to read --HF--.

Claim 5, Column 10, Line 13
    After "within" insert --the--.

Claim 12, Column 11, Line 18
    Change "a" to read --an--.

Claim 15, Column 11, Line 57
    After "silicon" add --.--.

Signed and Sealed this

Twenty-ninth Day of November, 1994

Attest:

BRUCE LEHMAN

*Attesting Officer*      *Commissioner of Patents and Trademarks*